United States Patent [19]

Balasubramanyam et al.

[11] Patent Number: 4,808,545
[45] Date of Patent: Feb. 28, 1989

[54] HIGH SPEED GAAS MESFET HAVING REFRACTORY CONTACTS AND A SELF-ALIGNED COLD GATE FABRICATION PROCESS

[75] Inventors: Karanam Balasubramanyam, Hopewell Junction; Robert R. Joseph, Poughkeepsie; Robert B. Renbeck, Staatsburg, all of N.Y.

[73] Assignee: International Business Machines Corporation, Armonk, N.Y.

[21] Appl. No.: 40,014

[22] Filed: Apr. 20, 1987

[51] Int. Cl.$^4$ ............................................. H01L 21/31
[52] U.S. Cl. ..................................... 437/41; 437/912; 437/175; 437/176; 437/184; 437/192; 357/15; 357/22; 148/DIG. 20
[58] Field of Search ..................... 357/15, 22; 437/41, 437/175, 176, 177, 178, 179, 912, 44, 45, 192, 201

[56] References Cited

U.S. PATENT DOCUMENTS

| | | | |
|---|---|---|---|
| 4,229,966 | 3/1988 | Koshino et al. | 357/15 |
| 4,472,872 | 9/1984 | Toyoda et al. | 437/176 |
| 4,503,599 | 3/1985 | Ueyanagi et al. | 437/177 |
| 4,546,540 | 10/1985 | Ueyanagi et al. | 427/176 |
| 4,553,316 | 11/1985 | Houston et al. | 357/15 |
| 4,670,090 | 6/1987 | Sheny et al. | 156/653 |
| 4,694,564 | 9/1987 | Enoki et al. | 437/245 |
| 4,700,455 | 10/1987 | Suimada et al. | 437/175 |
| 4,711,701 | 12/1987 | McLeirge | 437/41 |
| 4,731,339 | 3/1988 | Ryan et al. | 437/41 |
| 4,732,871 | 3/1988 | Buchmann et al. | 437/176 |

OTHER PUBLICATIONS

"Self Aligned Dummy Gate Sidewall-Spaced MESFET", IBM TDB, vol. 28, No. 7, Dec. 1985, pp. 2767-2768.

Yamasaki et al., "GaAs LSI . . .," IEEE Transfer Elec. Dev., vol. EP29, No. 11, Nov. 1982, pp. 1772-1777.

Ghandhi, VISI Fabrication Principles, John Wiley & Sons, 1983, pp. 419-474.

"A High Transconductance GaAs MESFET with Reduced Short Channel Effect Characteristics" by Kazuyoshi Ueno et al., 1985, IEEE IEDM 85/ pp. 82-85.

"Above 10 GHz Frequency Dividers with GaAs Advanced Saint and Air-Bridge Technology" Electronics Letters, vol. 22, 1986, p. 68.

"Use of Au/Te/Ni Films for Ohmic Contact to GaAs" by C. Ghosh et al., IEEE Electron Device Letters, vol. EDL-4, No. 9, Sep. 1983, pp. 301-302.

Primary Examiner—Brian E. Hearn
Assistant Examiner—T. N. Quach
Attorney, Agent, or Firm—T. R. Coca; A. V. Dougherty; Y. S. Yee

[57] ABSTRACT

Disclosed is a process fo fabrication of a MESFET in which starting with a GaAs substrate having a shallow N- layer covered with nitride, a submicron-wide dummy gate mask consisting of upper and lower portions made of dissimilar materials is formed. Multilayer organic and sidewall image transfer techniques are employed for forming the mask. The nitride is etched using the gate mask. N+ source/drain are formed by ion implantation. The lower portion of the gate mask is etched to expose the periphery of the nitride. Refractory metal for source/drain contacts is deposited. An oxide laeyr is deposited to passivate the source/drain contacts and to fully cover the exposed nitride periphery. The gate mask is removed. High temperature anneal is accomplished to simultaneously activate the N+ regions and anneal the contact metal. By RIE the exposed nitride removed leaving submicron spacers thereof. Gate metal is deposited in the gate region. Excess gate metal is removed to obtain a gate which has a planar top and has little lapping over the source/drain contacts.

20 Claims, 3 Drawing Sheets

HIGH SPEED GAAS MESFET HAVING REFRACTORY CONTACTS AND A SELF-ALIGNED COLD GATE FABRICATION PROCESS

The invention pertains to a novel high speed Gallium Arsenide (GaAs) metal semiconductor field effect transistor (MESFET) and a method for its fabrication. More particularly, the invention is a novel MESFET having shallow junctions, low resistance ohmic contacts and a gate which is of submicron length, low resistance, self-aligned to source/drain and has little gate-to-source/drain capacitance due to little lapping of the gate over the source/drain; and a novel cold gate method for fabrication of the MESFET.

BACKGROUND OF THE INVENTION

In the effort to realize high-speed and performance data processing systems, there has been, based on electronic device innovation and specifically on submicron technology, a surge in the development of microstructure devices that take advantage of the high speed property of electrons in GaAs. A number of transistor types have been built. The most commercially successful of these devices is the MESFET—both the depletion mode (or D-MESFET) and enhancement mode (or E-MESFET) types. Under the gate of a D-MESFET is a normally-on region depleted of electrons which allows current to pass between the source and drain of the transistor. This region is doped to be n-type. When a negative voltage is applied, the width of the depletion region increases, the channel width through which the current flows decreases and the current flow is eventually pinched off. In an E-MESFET, the region under the gate is doped so that the channel is normally pinched off. Thus, small positive gate bias voltage must be applied for current to flow between the source and drain.

To meet the demands of higher speed and integration density, the MESFET needs continual improvement. Potential improvements include shortening of the gate length, reducing the series resistance between the source and gate, decreasing the parasitic capacitances, especially the gate-source and gate-drain overlap capacitances, rendering the source/drain junction depths small and providing contact metallurgy which has a low resistivity and high thermal stability and compatible with shallow junctions.

In this connection, the publication by K. Ueno et al entitled "High Transconductance GaAs MESFET with Reduced Short Channel Effect Characteristics" IEDM 85, pages 82-85 (1985) describes a GaAs MESFET, wherein the gate formed by etching a WSi$_x$ film. This publication discloses reducing short channel effect by employing a highly doped channel layer grown by molecular beam epitaxy and minimizing parasitic capacitance by utilizing oxide sidewall spacers between the gate and source/drain. Ueno et al uses a hot gate process in which the gate is formed first, followed by the formation of the source/drain. The basic disadvantage of the hot gate process is that the gate metal (WSi$_x$) has a high resistivity which is not desirable for interconnection purposes. Also, the hot gate process does not permit threshold voltage trimming late in the device fabrication.

The publication by K. Osaiune et al entitled "Above 10 GHz Frequency Dividers with GaAs Advanced Saint and Air-bridge Technology", Electronics Letters, Vol. 22, page 69 (1986) discloses a flat-gate MESFET having a reduced gate overlap parasitic capacitance. The gate is formed from a dual layer of Mo and Au. After forming the gate by ion-milling planarization process, source/drain ohmic contacts are formed by AuGe/Ni deposition and sintering. The basic shortcoming of this disclosure is that it is unsuitable for forming submicron sized MESFET owing to significant (as much as 0.5 micron) lateral migration at high temperature of the gold in the AuGe/Ni metallurgy used for source/drain contacts causing electrical shorting. Also, the vertical transport of the gold precludes use of this process for forming shallow junction devices. Importantly, this process is limited to fabrication of a MESFET having a gate width dictated by resolution limit of lithography.

The invention overcomes these and other problems of the prior art by means of a novel MESFET structure and a novel cold gate process for its fabrication.

SUMMARY OF THE INVENTION

The novel MESFET structure in accordance with the invention is provided with a gate which is of submicron length, symmetrical, planar and self-aligned to the source/drain via submicron-wide insulator spacers. Importantly, the gate does not overlap the source/drain, thereby eliminating the gate to source/drain overlap capacitance and increasing the device speed. The provision of the sidewall spacers minimizes device punch-through and short channel effects and permits good control of the device channel length and threshold voltage. Since the source/drain are placed extremely close to the gate, the source-gate series resistance is minimized, contributing to the device speed. The MESFET is provided with a compatible In-Ge-Mo-W refractory metallurgy for source/drain contacts. Since this metallurgy is free of lateral and vertical penetration problems, the source/drain junction depth can be rendered extremely small.

In accordance with the novel method of forming the MESFET, starting with a semi-insulating GaAs substrate having a lightly N doped thin surface layer which is covered by a first insulator, a submicron-wide mask (dummy gate) composed of bottom and top portions of dissimilar materials is formed. Multilayer organic and sidewall image transfer techniques are used for forming the submicron mask. The insulator is etched using the submicron-wide mask to limit it to the channel region. N-type ions are introduced into the substrate forming source and drain regions self-aligned to the remnant insulator. Then, by side etching the bottom portion of the mask by reactive ion etching further reduction in the width of the dummy gate (which determines the actual gate length of the MESFET) is obtained. This step results in exposure of the peripheral portions of the first insulator. Then, by lift-off process refractory metallurgy composed of In, Ge, Mo and W, in order, is formed on the source and drain regions for establishing Ohmic contacts therewith while protecting the first insulator over the channel region by the mask. A second insulator layer is deposited non-conformally ensuring that the peripheries of the first insulator are fully covered. The mask is removed to expose the central portion of the first insulator overlying the channel region. A high temperature (750°-900° C.) anneal is accomplished to simultaneously anneal the contact metallurgy and activate the source/drain dopant. The insulator central portion is etched off thereby exposing the gate region of the substrate. Gate metal such as W-Al is conformally deposited in the gate region. By planarization process, the gate metal is transformed into a flat gate which is limited essentially to the gate area without any lapping over the source/drain.

BRIEF DESCRIPTION OF THE DRAWINGS

The novel features and process steps characteristic of the invention are set forth in the appended claims. The invention itself, however, will be best understood by reference to the detailed description which follows in conjunction with the accompanying drawings, wherein:

DETAILED DESCRIPTION OF THE PREFERRED EMBODIMENT

Figure 12:
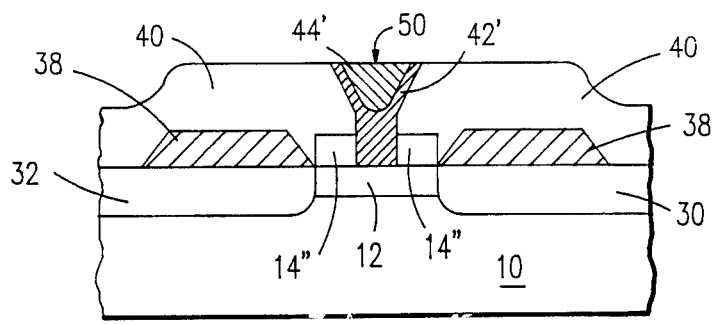

Referring to FIG. 12, the MESFET structure in accordance with the invention consists of a thin N-layer 12 of dopant concentration range of about $5 \times 10^{16} - 5 \times 10^{17}$ atoms/cc formed on a semi-insulating GaAs substrate 10. Contiguous with the N− layer 12 and on either side thereof are shallow N+ source 30 and drain 32. The source and drain is contacted by refractory Ohmic contacts 38 made of In-Ge-Mo-W quarternary layer which is stable at high temperatures and does not penetrate vertically or laterally. The source 30 and drain 32 are self-aligned to the gate 50 via submicron-wide nitride spacers 14″. The spacers 14″ space the source/drain away from the gate region by an optimal distance to reduce the source-gate series resistance and accurately control the device channel length. The spacers 14″, by displacing the N+ source/drain from the edge of the gate 50, also enable formation of a graded junction thereunder. Such a graded junction reduces short channel effects enabling control of the device threshold voltage. The gate 50 is of submicron length and has a substantially planar top surface with absence of lapping over the source and drain contacts 38. Owing to this non-overlap, the parasitic capacitances are substantially minimized.

Figure 1:
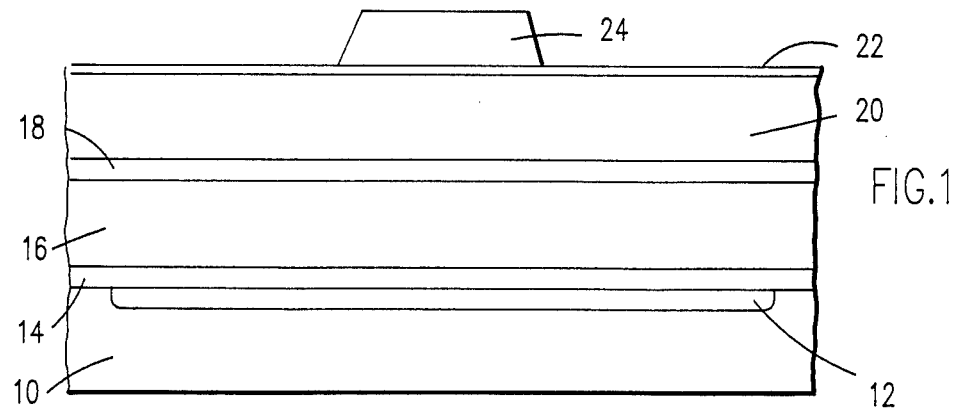
FIGS. 1–12 are flow diagrams illustrating by sequential cross-sectional representation the process steps of the present invention culminating in the novel MESFET structure of the invention shown in FIG. 12.

The process for forming the novel MESFET illustrated in FIG. 12, will now be described with reference to FIGS. 1–12. Starting with the semi-insulating GaAs substrate 10 a threshold implant using N type species such as Si, S or Se is accomplished forming the N− region 12 of thickness about 100–500 A as indicated in FIG. 1. In a specific example, Si ions of energy 85–100 Kev and dose $5 \times 10^{11} - 5 \times 10^{14}$ atoms/sq. cm. resulting in a concentration of approximately $5 \times 10^{16} - 5 \times 10^{17}$ atoms/cc is used. Next, a plasmadeposited nitride layer 14 of typical thickness 1000–3000 A is formed. The nitride 14 will serve as a capping layer for high temperature activation of source/drain implant and as an insulator spacer for the gate as will become apparent at the completion of the present fabrication process. Then, an organic material layer 16 such as photoresist or polyimide of thickness 8000–10,000 A is applied and vacuum baked at an approximate temperature to drive off oxygen and water vapor. Si layer 18 of thickness 500–1500 A is deposited by evaporation or sputtering on the organic 16. The Si layer 18 will serve as an etch stop while etching the photoresist layer 20 that is formed thereover in the next process step of the invention. A thin $SiO_2$ layer 22 is formed to promote adhesion between layer 20 and the resist layer that will be applied next. An imaging resist 24 is then formed by applying and defining a photoresist layer.

Figure 2:
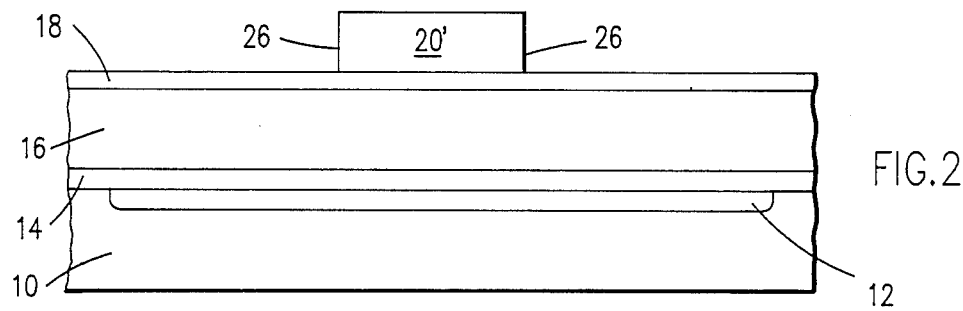
Figure 3:
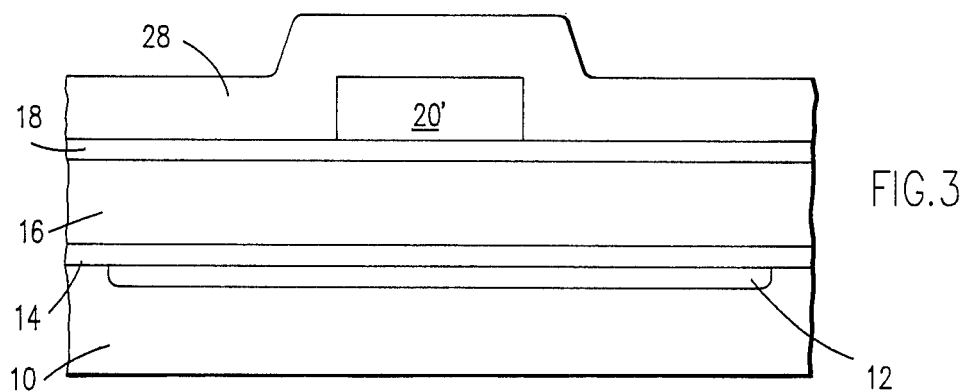
Figure 4:
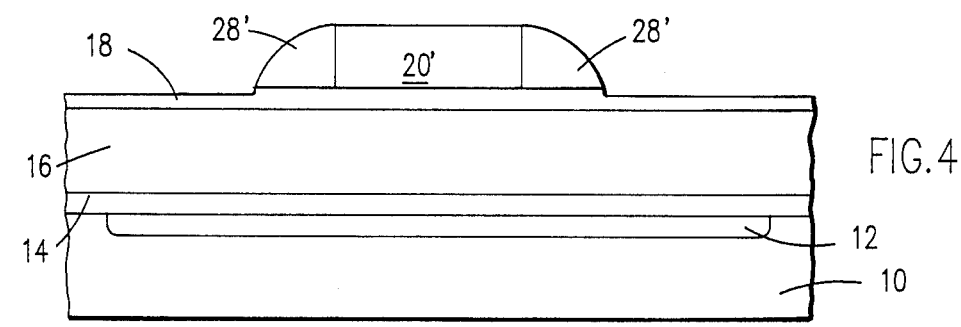

As illustrated in FIG. 2, using the imaging resist 24 as a mask the resist layer 20 is patterned by conventional lithography and etching into mandrel 20′ having substantially vertical walls 26. Reactive ion etching (RIE) using oxygen species will be suitable for defining the mandrel 20′. Insulator sidewalls are established at the walls 26. Toward this end, as illustrated in FIGS. 3 and 4, plasma nitride 28 of thickness about 4000–7000 A is conformally deposited followed by RIE using $CF_4$ and $H_2$. The submicron-wide nitride sidewalls formed as a result are designated by numeral 28′ in FIG. 4. The resist mandrel 20′ is then removed by ashing, leaving free-standing nitride sidewall 28′ as illustrated in FIG. 5.

Figure 5:
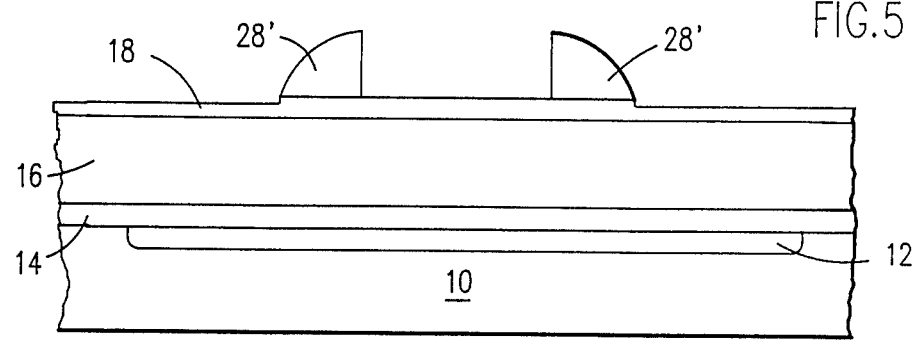

Continuing with the process aspect of the invention, referring to FIG. 5, using the sidewall 28′ as a mask, the Si layer 18 is etched by RIE using freon-11 and air mixture. The organic layer 16 is then etched by RIE using the sidewall 28′ as a mask down to the nitride 14 obtaining the organic mask 16′. $O_2$ species are employed for this etching to obtain substantially vertical surfaces for the resist 16′. In this manner a submicron mask structure (also referred to herein as gate mask and dummy gate) 16′-18′-28′ composed of a lower portion 16′ of an organic material and an upper portion 18′-28′ of silicon and silicon nitride materials is formed. In other words, the submicron mask structure is composed of upper and lower portions made of dissimilar materials in terms of their etching characteristics, resistance to temperature, etc. The formation of sidewall 28′ and the foregoing process steps utilized for the creation of the dummy gate mask 16′-18′-28′ shall be referred to hereinafter as, the "sidewall image transfer" process.

Figure 6:
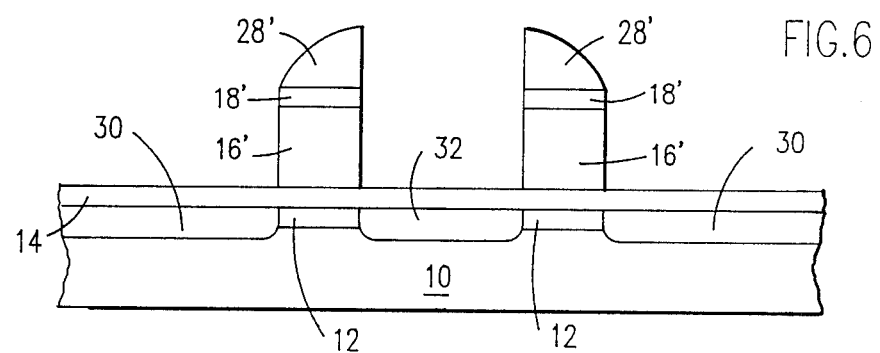

The next process step is formation of N+ source and drain regions 30 and 32, respectively (FIG. 6). This is accomplished by ion implantation through the nitride layer 14 into the body of the substrate 10 using the structure 16′-18′-28′ as an implant mask. The source and drain regions are self-aligned to the gate mask. Si ions of energy 50–150 Kev and dose $1 \times 10^{13} - 5 \times 10^{14}$ ions/sq.cm. are used to obtain shallow source and drain regions of junction depth 0.05–0.2 microns and dopant concentration in the range of pproximately $1.0 \times 10^{18} - 5 \times 10^{18}$ atoms/cc. The energy and dose of the ions may be adjusted to obtain still shallower junctions.

The submicron-wide mask structure 16′-18′-28′, which owing to its formation around the mandrel 20′ (FIG. 4) is (rectangular/square) ring-shaped, is trimmed using a trim mask to limit it to the areas where a MESFET gate is desired. In fact, by appropriately trimming this mask structure into two side-by-side gate masks as illustrated in FIG. 6, two side-by-side MESFETs may be simultaneously formed. For siplicity of discussion and clarity of illustration, in the remainder of the drawings (FIGS. 7–12) will be shown only the gate mask corresponding to the right portion shown in FIG. 6.

Figures 7, 8:
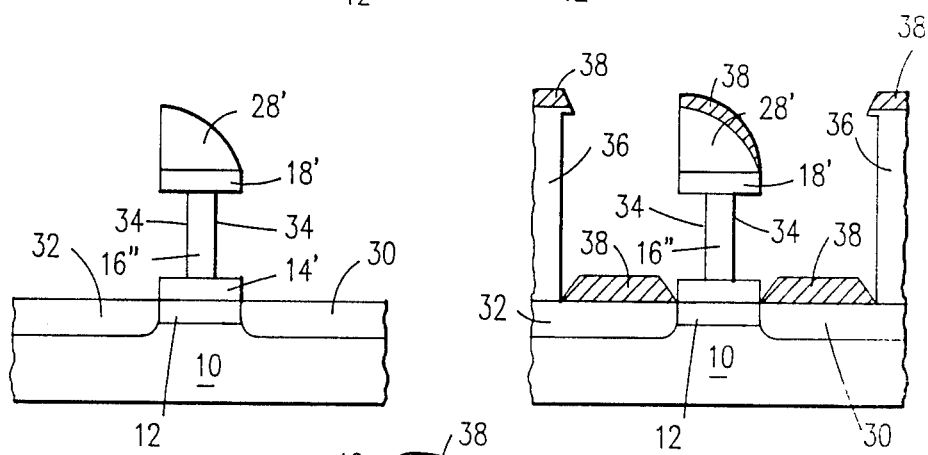

Referring to FIG. 7, after forming the selfaligned source 30 and drain 32, the plasma nitride portion which is not covered by the gate mask 16′-18′-28′ is removed by anisotropic RIE. Typically, $CF_4$ and $H_2$ plasma is used for this etching step. The portion of the nitride layer 14 that remains following this etching process is designated by 14′.

The bottom portion 16′ of the gate mask is then reduced in its width to prescribe the actual physical gate length of the MESFET. This reduction is achieved, as illustrated in FIG. 7, by undercutting the organic 16'. RIE using O$_2$ is ideally suitable for this step. The amount of undercut is dictated by the desired physical gate length of the MESFET. After carefully setting the pressure, power, flow rates, and other parameters associated with this RIE process, a controlled timed RIE is accomplished to reduce the lateral dimension of the organic 16'. By optimizing the RIE process conditions, side etching of the order of 0.1–0.25 can be achieved with good precision. The trimmed organic, which is designated by 16" in FIG. 7, has substantially vertical walls 34. In this manner the width of submicron-dimensioned dummy gate formed by sidewall image transfer is further reduced with great precision to less than that achievable by sidewall image transfer alone.

Following the adjustment of the gate mask to match its base width to that of the desired gate length, source/drain Ohmic contacts are formed by conventional lift-off. A photoresist lift-off stencil 36 having an opening corresponding to the device active region is formed as indicated in FIG. 8 by conventional photo exposure, development, etc. of a photoresist layer. Refractory metallurgy 38 is then formed in the source/drain areas. The preferred metallurgy is quarternary layer of In-Ge-Mo-W. The tungsten component of this metallurgy serves to reduce the sheet resistance of the contact. This metallurgy can withstand high temperature annealing (which will be performed in due course of this process sequence) and offers excellent morphology. This refractory metal is ideally suited for shallow (source/drain) junctions since it does not migrate, thereby being virtually free of penetration into the junctions. The metallurgy is typically formed by E-beam evaporation. The component metals In, Ge, Mo and W are deposited in sequence in the same E-beam deposition system at the same temperature and pressure. During the deposition process the substrate is maintained at room temperature. Consequently, even though the evaporation of the metal is accomplished at a higher temperature, the actual deposition on the substrate takes place at room temperature. Typical thicknesses of the component metals constituting the contact metal are as follows: In 10–100 A; Ge 50–300 A; Mo 500–1000 A; and W 500–2000 A. Since the contact metallurgy 38 is deposited in a blanket fashion, it is formed also on the upper portion 28' of the gate mask. The lift-off stencil 36 is then removed leaving the gate mask 16"-18'-28'-38.

Figure 9:
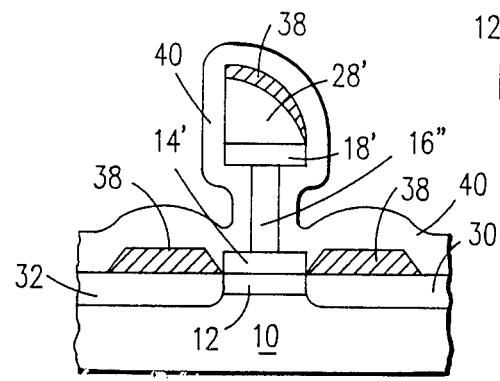

Silicon dioxide layer 40 is the deposited by plasma deposition to serve as a passivation layer for the contact metallurgy 38. During this oxide deposition step, not only are the source/drain contacts fully covered with the oxide, but also coverage of the nitride layer 14' which is not masked by the organic 16" takes place. Additionally, the vertical walls 34 of the organic mask 16" are coated with a thin layer of the oxide, as illustrated in FIG. 9. Owing to the peculiar topology of the structure, the thickness of the plasma oxide 40 will not be uniform, but typically the maximum thickness of the oxide 40 is about 2000–4000 A.

Figure 10:
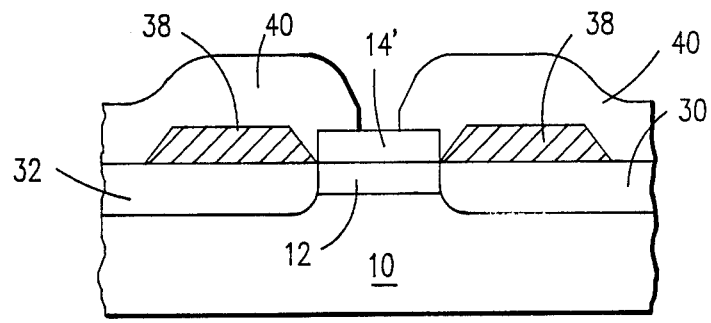

The thin oxide adhering to the walls 34 is then removed by a buffered HF etch, leaving the nitride 14' which projects beyond the dimensions of the mask portion 16" fully protected by the oxide 40. At this process stage, an optional N type angular ion implantation step may be performed to repopulate any charges that may have depleted from the N− layer 12. N-type ions are implanted at an angle through the nitride 14' into the layer 12. Next, the gate mask composed of the stack 16"-18'-28-'38 is removed by by lift-off by subjecting the organic layer 16" to a wet etchant. The structure that results following this gate mask removal is shown in FIG. 10.

Continuing with the process sequence, next the structure is subjected to a high temperature annealing, at a temperature of about 750°–900° C. for a time of 20-40 mins. This single anneal step accomplishes the dual function of activating the dopant introduced into the source 30 and drain 32 and reducing the Ohmic resistance of the contact metallurgy 38. Since the nitride 14' fully caps the N− layer 12 (FIG. 10), there will occur little out-diffusion of the threshold-determining dopant in layer 12. Since this process permits no depletion of the dopant population in the N− layer 12, the threshold voltage will be accurately maintained at that set by the threshold implant at the inception.

Figure 11A:
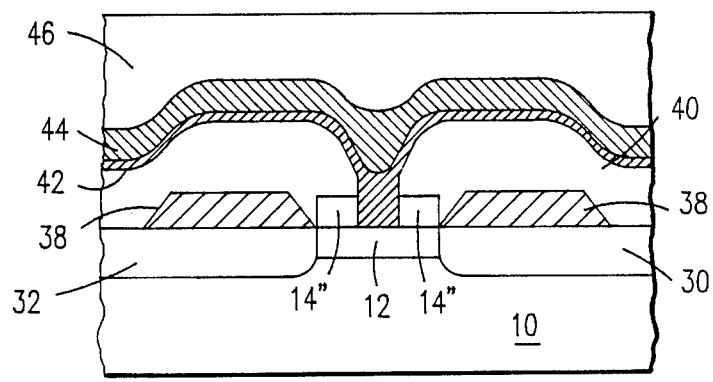

Next, the structure is subjected to RIE using CF$_4$ and H$_2$ to selectively remove the unmasked portion of the nitride 14', to expose the gate region. Since the oxide 40 masks the peripheral portion of the nitride 14' during this RIE step, submicron-wide (typically, 0.05–0.3 micron) nitride spacers 14" of a precise dimension are formed as illustrated in FIG. 11A. The nitride spacers 14" physically and electrically separate the source and drain contacts 30 and 32, respectively, from the gate that will be formed in the gate region, next.

A gate composed of a metallurgy such as W-Al is sputter deposited to completely fill the gate region opened up by the opening in the nitride 14". Typical thickness of the W layer 42 is about 500 A and that of the Al layer 44 is about 3000 A. This deposited dual metallurgical layer conforms to the non-planar topology of the existing structure as indicated in FIG. 11A.

The next process step is planarization of the non-planar gate metal to achieve a flat gate which does not overlap the source and drain regions 30 and 32, respectively. Planarization of the deposited gate metal may be achieved as illustrated in FIG. 11A, by forming a thick photoresist or polyimide layer 46. This is followed by an etchback or planarization step to remove the excess gate metal and obtain a planar gate 50 formed of the bottom W portion 42' and top Al portion 44' (FIG. 12). The extent of removal of the gate metal, while governed by the need to avoid lapping of the gate over the source/drain, is dictated by the sheet resistance desired of the gate. Too much removal of the gate metal, however, increases the sheet resistance of the resulting gate. The gate 50 is symmetrical with respect to the vertical plane passing through the center of the gate region and does not overlap the source/drain 30/32.

Figure 11B:
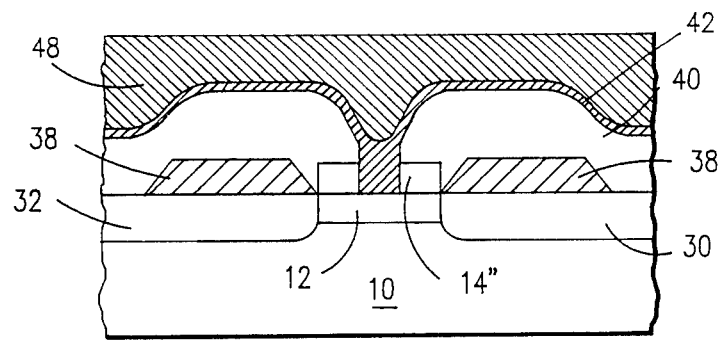

An alternative process of forming the gate 50, which is illustrated in FIG. 11B, is to form the W and Al gate metal layers 42 and 48 by bias sputtering. By the nature of bias sputtering, the gate cavity is completely filled with the gate metal and an essentially planar topology is obtained. Next, by etchback or planarization, as previously described, the excess gate metal is removed obtaining the planar and nonoverlapping gate MESFET structure of FIG. 12.

The MESFET structure and the process of its fabrication described have several advantages. The parasitic capacitance characteristic of overlapped gate metal is virtually absent due to the plugging of the gate cavity and subsequent removal of the metal in the unwanted areas. The dependence of the device threshold voltage on the gate length due to the presence of the N+ source/drain regions in the vicinity of the gate contact is eliminated by adjusting the width of the submicron-wide nitride spacers abutting the gate and spacing the gate 50 from the N+ regions 30 and 32 (FIG. 12). The perfect planar surface obtained after the gate metallization permits to have tighter pitches for the subsequent wiring levels. The thermally stable refractory contact metallurgy is perfectly suitable for rendering the source/drain junction depths extremely low. Since annealing of the N+ source/drain implant and refractory Ohmic contacts is done simultaneously, an anneal step is eliminated. By increasing the thickness of the passivation oxide 40, a thicker gate (W-Al) stack can be accommodated for submicron devices requiring low sheet resistance (about 1 Ohm/sq.) at a fixed gate capacitance.

Thus there has been provided a novel MESFET structure and a fabrication process which satisfies the objects and advantages set forth above. While the invention has been described in conjunction with specific preferred embodiments, it is evident that many alternatives and variations will be apparent to those skilled in the art in light of the foregoing description. It is, therefore, contemplated that the appended claims will embrace any such alternatives, modifications and variations as fall within the true scope and spirit of the invention.

We claim:

1. Process for forming a MESFET comprising: providing a GaAs substrate having a lightly doped shallow surface layer of a given conductivity type covered by a first insulator layer:
   forming a submicron-wide mask having bottom and top portions on said first insulator;
   utilizing said mask, (a) implanting in said substrate ions of said conductivity type forming source and drain regions self-aligned to said mask structure and (b) removing said first insulator not covered by said mask strucure to limit said first insulator to lie over the channel region of said MESFET;
   reducing the width of the bottom portion of said mask to correspond with the desired MESFET gate length;
   forming a conductive material over said source and drain regions;
   nonconformally depositing a second insulator on the resulting structure;
   removing said mask to expose the portion of said first insulator thereunder;
   etching said exposed portion of said first insulator to uncover a gate region in said substrate, and forming over said channel region submicron spacers of said first insulator self-aligned to said gate region and said source and drain regions; and
   forming a gate metal in said gate region.

2. The process as in claim 1 further comprising planarizing said gate metal and said second insulator to obtain a planar gate with little lapping over the source or drain regions.

3. The process as in claim 1 wherein said gate metal is formed by sputtering.

4. The process as in claim 1 wherein said submicron-wide mask is formed by sidewall image transfer process.

5. The process as in claim 1 wherein the top and bottom portions of said mask are composed of dissimilar materials.

6. The process as in claim 5 wherein said bottom portion is formed of an organic material.

7. The process as in claim 1 wherein said said step of reducing the width of said bottom portion is accomplished by undercutting the bottom portion relative to said top portion by reactive ion etching.

8. The process as in claim 1 wherein said undercutting is accomplished to etch off 0.1-0.25 microns thickness on all sides of said bottom portion.

9. The process as in claim 1 wherein said conductive material is formed by lift-off process.

10. The process as in claim 1 wherein said second insulator is formed by plasma deposition.

11. The process as in claim 1 wherein said conductive material is the quadruple layer of In-Ge-Mo-W.

12. The process as in claim 11 wherein said conductive material is formed by E-beam evaporation of In, Ge, Mo and W in the same evaporation system at the same temperature and pressure.

13. The process as in claim 12 wherein said evaporation is accomplished by maintaining said substrate at room temperature.

14. The process as in claim 1 wherein said first insulator is plasma-deposited silicon nitride.

15. The process as in claim 1 wherein said conductivity type is N type.

16. Process for forming a GaAs MESFET comprising:
    providing a GaAs substrate covered with a first insulator layer; forming a submicron-wide dummy gate composed of bottom and top portions made of dissimilar materials on said first insulator;
    utilizing said dummy gate as a mask, (a) implanting in said substrate ions of a given conductivity type forming source and drain regions self-aligned to said dummy gate and (b) removing said first insulator not masked by said dummy gate to limit said first insulator to lie over the channel reqion of said MESFET;
    side etching said bottom portion to reduce the width of said bottom portion relative to that of said top portion and thereby exposing a peripheral portion of said first insulator;
    depositing a conductive material over said source and drain regions while masking said peripheral portion by the top portion of said dummy gate;
    covering said conductive material and said peripheral portion of said first insulator by depositing a second insulator;
    removing said dummy gate to expose a central portion of said first insulator;
    etching off said central portion expose a gate region of said substrate, and forming over said channel region submicron spacers of said first insulator self-aligned to said gate region and said source and drain regions; and
    forming a conductive gate material in said gate region.

17. The process as in claim 16 further comprising forming a shallow and lightly doped region of the first conductivity type on the surface of said substrate prior to covering with said first insulator.

18. The process as in claim 17 wherein said dummy gate is formed by utilizing multilayer resist and sidewall image transfer techniques.

19. The process as in claim 17 wherein said dummy gate forming step comprises:
    forming, in order, first and second layers of photosensitive material on said first insulator;

patterning said second layer into a mandrel having substantially vertical surface using an imaging layer and photolithography and etching processes;

depositing conformally a third insulator layer of submicron thickness on said patterned second layer and the first layer not masked by said mandrel;

establishing a submicron-wide sidewall of said third insulator on said vertical surfaces by anisotropic etching of said third insulator;

removing said mandrel; and anisotropically etching said first layer using said sidewall as a mask.

20. The process as in claim 16 further comprising planarizing said gate material and said second insulator to obtain a top gate surface which is substantially planar and coplanar with the top surface of said second insulator.

* * * * *